(12) United States Patent
Fishkin et al.

(10) Patent No.: US 6,332,470 B1
(45) Date of Patent: Dec. 25, 2001

(54) AEROSOL SUBSTRATE CLEANER

(76) Inventors: Boris Fishkin, 155 Exeter Ave., San Carlos, CA (US) 94070; Kyle A. Brown, 655 S. Fair Oaks Ave., Apt. K-117, Sunnyvale, CA (US) 94086

(*) Notice: Subject to any disclaimer, the term of this patent is extended or adjusted under 35 U.S.C. 154(b) by 0 days.

(21) Appl. No.: 09/000,518

(22) Filed: Dec. 30, 1997

(51) Int. Cl.$^7$ .................................................. B08B 3/02
(52) U.S. Cl. ................................. 134/102.1; 134/102.2; 134/105; 134/902
(58) Field of Search .................... 134/102.2, 100.1, 134/102.1, 902, 107, 105; 261/140.1, 152

(56) References Cited

U.S. PATENT DOCUMENTS

| | | | |
|---|---|---|---|
| 4,161,356 | * | 7/1979 | Giffin et al. .......................... 354/323 |
| 4,207,180 | * | 6/1980 | Chang ...................................... 210/7 |
| 4,817,652 | * | 4/1989 | Liu et al. . | |
| 4,903,717 | * | 2/1990 | Sumnitsch .............................. 134/99 |
| 5,027,841 | * | 7/1991 | Breunsbach et al. ................... 134/95 |
| 5,062,898 | * | 11/1991 | McDermott et al. ..................... 134/7 |
| 5,120,370 | * | 6/1992 | Mori et al. ........................ 134/22.15 |
| 5,129,956 | * | 7/1992 | Pickering et al. ...................... 134/15 |
| 5,164,049 | * | 11/1992 | Clark et al. . | |
| 5,174,855 | * | 12/1992 | Tanaka ................................. 156/626 |
| 5,235,995 | * | 8/1993 | Bergman ............................... 134/105 |
| 5,273,589 | | 12/1993 | Griswold et al. ....................... 134/21 |
| 5,288,333 | * | 2/1994 | Tanaka et al. .......................... 134/11 |

(List continued on next page.)

FOREIGN PATENT DOCUMENTS

| | | |
|---|---|---|
| 0 663 265 A1 | 7/1995 | (EP) . |
| 0 712 691 A1 | 5/1996 | (EP) . |
| 0 738 561 A1 | 10/1996 | (EP) . |
| 881 040 A2 | 12/1998 | (EP) . |
| 881 484 A2 | 12/1998 | (EP) . |
| 359168446 | * 9/1984 | (JP) ...................................... 134/902 |
| 0131026 | * 6/1991 | (JP) ...................................... 134/902 |
| 3-234467 | 10/1991 | (JP) . |
| 404215436 | * 8/1992 | (JP) ...................................... 134/902 |
| WO 96/14944 | 5/1996 | (WO) . |

OTHER PUBLICATIONS

Dearing, et al., Alternatives to Chlorofluorocarbon Fluids in the Cleaning of Oxygen and Aerospace Systems and Components, *ASTM Publication*, pp. 66–77.

Production of Test Aerosols, *A Wiley–Interscience publication*, pp. 379–395.

Ali, et al., Investigation the Effect of Secondary Palten Pressure on Post–Chemical–Mechanical Planarization Cleaning, *Microcontamination*, pp. 45–50, Oct. 1994.

Kolenkow and Nagahara, Chemical–Mechanical Wafer Polishing and Planarization in Batch Systems, *Solid State Technology*, pp. 112–114, Jun. 1992.

Krussell, et al., Mechanical brush scrubbing for post–cmp clean, *Solid State Technology*, pp. 109–114, Jun. 1995.

Muraka, et al., Advanced Metallization for Devices and Circuits–Science, Technology and Manufacturability, (*Symposiium held Apr. 4–8, San Francisco, CA., USA, 1994*), *Materials Research Society Symposium Proceedings*, 377:637, 1994.

*Primary Examiner*—Frankie L. Stinson

(57) ABSTRACT

An apparatus for cleaning a substrate includes a source of pressurized carrier gas and a body of cleaning agent in liquid form. A first conduit directs the pressurized carrier gas from the carrier gas source to the body of cleaning agent. A second conduit carries a flow of the carrier gas away from the body of the cleaning agent. The carrier gas flow carried by the second conduit includes cleaning agent in vapor form acquired from the body of cleaning agent. A nozzle is coupled to the second conduit to cause droplets of the cleaning agent to impinge upon a first face of the substrate to be cleaned.

26 Claims, 2 Drawing Sheets

U.S. PATENT DOCUMENTS

| | | | | |
|---|---|---|---|---|
| 5,301,701 | * | 4/1994 | Nafziger | 134/95.2 |
| 5,306,350 | * | 4/1994 | Hoy et al. | 134/11 |
| 5,361,787 | * | 11/1994 | Miyazaki et al. | 134/57 R |
| 5,366,156 | * | 11/1994 | Bauer et al. | 239/135 |
| 5,372,153 | * | 12/1994 | Dobson | 134/107 |
| 5,372,652 | * | 12/1994 | Srikrishnan et al. | 134/7 |
| 5,413,671 | * | 5/1995 | Ketchum | 216/37 |
| 5,413,941 | | 5/1995 | Koos et al. | 437/8 |
| 5,427,878 | | 6/1995 | Corliss | 430/30 |
| 5,456,758 | | 10/1995 | Menon | 134/33 |
| 5,512,106 | * | 4/1996 | Tamai et al. | 134/7 |
| 5,555,902 | * | 9/1996 | Menon . | |
| 5,558,110 | | 9/1996 | Williford, Jr. | 134/56 R |
| 5,565,149 | * | 10/1996 | Page et al. | 261/140.1 |
| 5,578,193 | * | 11/1996 | Aoki et al. | 205/746 |
| 5,579,792 | * | 12/1996 | Stanasolovich et al. | 134/184 |
| 5,605,760 | | 2/1997 | Roberts | 428/409 |
| 5,640,242 | | 6/1997 | O'Boyle et al. | 356/381 |
| 5,651,834 | * | 7/1997 | Jon et al. | 134/31 |
| 5,651,836 | * | 7/1997 | Suzuki | 134/34 |
| 5,663,797 | | 9/1997 | Sandhu | 438/16 |
| 5,672,091 | | 9/1997 | Takahashi et al. | 451/6 |
| 5,685,327 | * | 11/1997 | Mohindra et al. | 134/95.2 |
| 5,791,969 | | 8/1998 | Lund | 451/5 |
| 5,857,474 | * | 1/1999 | Sakai et al. . | |
| 5,872,633 | | 2/1999 | Holzapfel et al. | 356/381 |
| 5,873,380 | * | 2/1999 | Kanno | 134/102.1 |
| 5,887,605 | * | 3/1999 | Lee et al. | 134/102.2 |
| 5,893,796 | | 4/1999 | Birang et al. | 451/526 |
| 5,896,875 | * | 4/1999 | Yoneda . | |
| 5,958,146 | * | 9/1999 | Mohindra et al. . | |
| 5,964,643 | | 10/1999 | Birang et al. | 451/6 |
| 5,968,285 | * | 10/1999 | Ferrell et al. . | |
| 6,053,984 | * | 4/2000 | Petvai et al. . | |

* cited by examiner

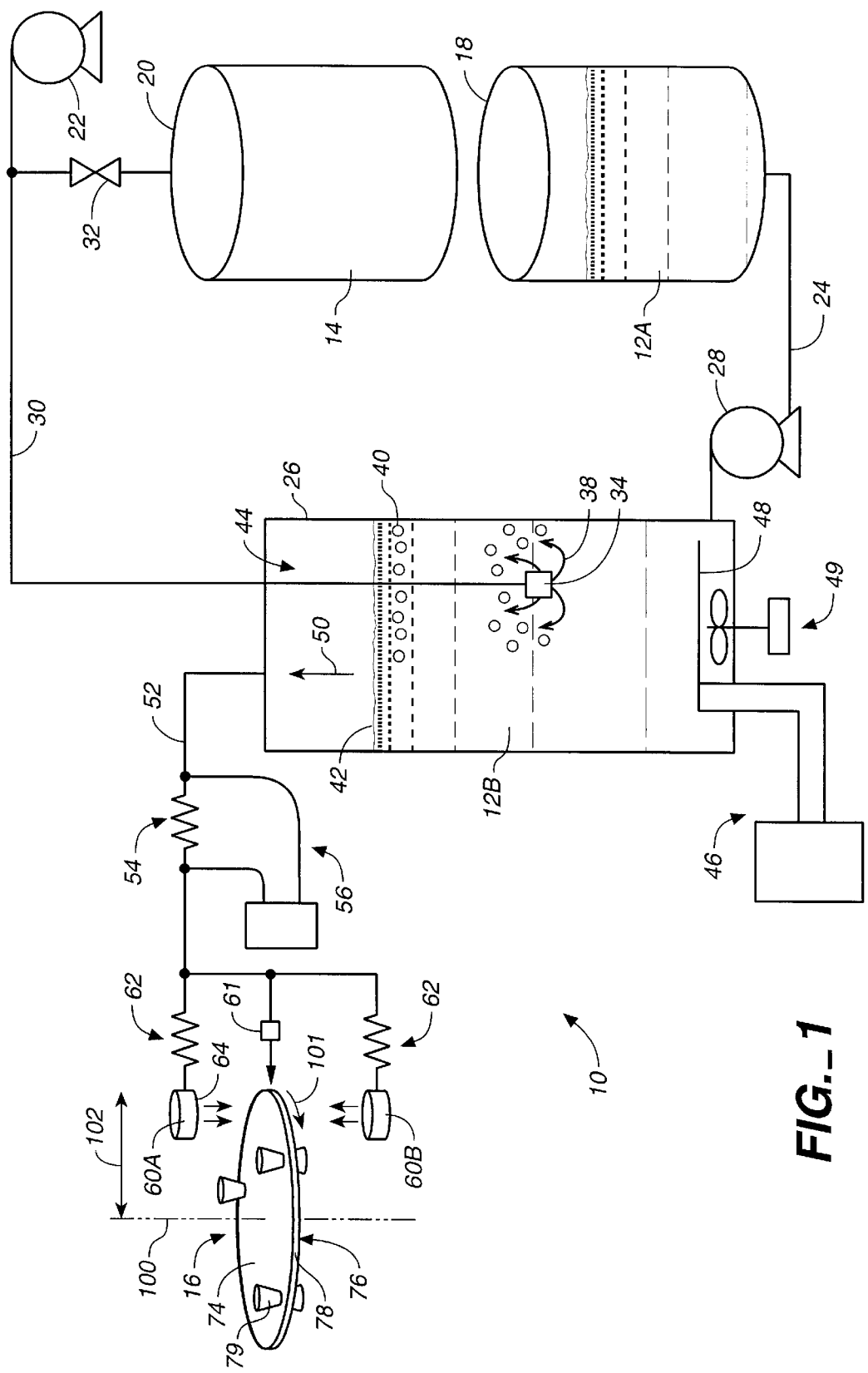
FIG._1

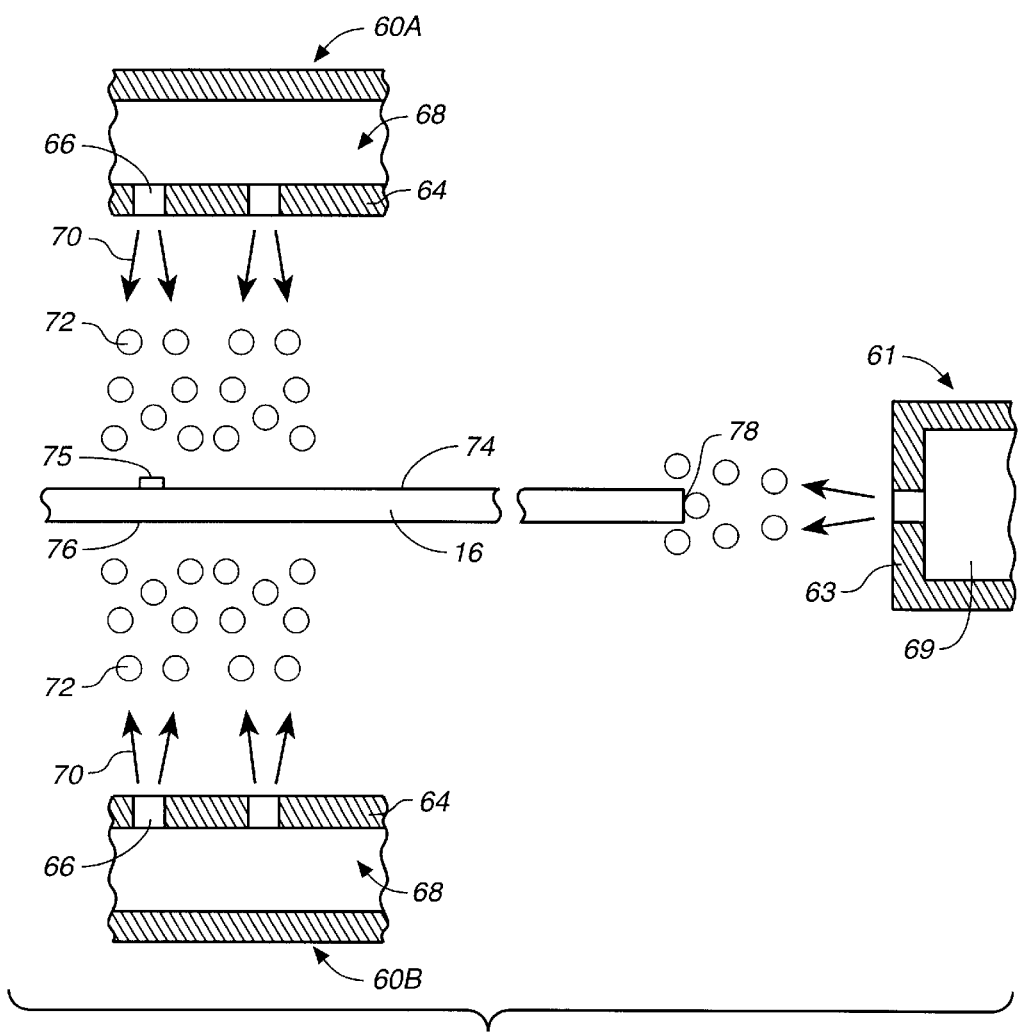
FIG._2
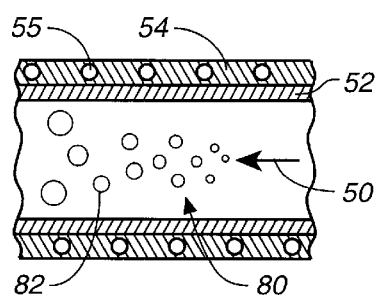
FIG._3

AEROSOL SUBSTRATE CLEANER

BACKGROUND

1. Technical Field

This invention relates to semiconductor device manufacturing, and more particularly to the post chemical mechanical polishing (CMP) cleaning of semiconductor substrates.

2. Background Information

During the manufacture of semiconductor devices, after particular manufacturing steps, it is desired or required to remove contaminant particles. If not removed, such particles may cause defects in the device being manufactured or otherwise interfere with the manufacturing process.

For example, integrated circuits are typically formed on silicon wafers by the sequential deposition of conductive, semiconductive or insulative layers. After each layer is deposited, the layer is etched to create circuitry features. After a series of layers are sequentially deposited and etched, the outer or uppermost surface of the substrate, i.e., the exposed surface of the substrate, becomes increasingly nonplanar. The substrate may be periodically planarized via a process such a chemical mechanical polishing. This method typically includes the mounting of the substrate on a carrier or polishing head and the placing of the exposed surface of the substrate against a rotating polishing pad. A polishing slurry, which may include chemically-reactive agents and/or abrasive particles, may be introduced to facilitate the polishing. The polishing leaves the surfaces of the substrate contaminated with polishing byproducts typically including silica, alumina, or other abusive particles from the slurry as well as a variety of other particles. Other residues from the polishing include the slurry itself, and often rubber or lubricant residue left by the carrier on the unpolished surface of the substrate.

A variety of methods and apparatus have been used or proposed for substrate cleaning after CMP. Broadly characterized, these include immersive and spray techniques. One immersive technique involves placing the substrates in an alkaline solution of ammonium hydroxide, water and hydrogen peroxide, and subjecting the solution to ultrasonic agitation to remove contaminants. The substrates may then be rinsed and dried.

Prominent among spray techniques are a variety of cryogenic techniques. Such techniques require the use of a high pressure gas and frequently may include the introduction of a cleaning agent. The cleaning agent is frozen by the expansion of the gas through a nozzle and is thus impinged upon the surface of the substrate as a spray of frozen particles. Cryogenic methods typically make intensive use of the gas which may prove expensive.

Somewhat intermediate of the immersion and spray methods are methods which involve directing a stream of liquid onto a substrate surface being cleaned. A liquid cleaning agent is sprayed from a high pressure nozzle, with an associated high kinetic energy, for dislodging small particles from the surface. Such methods may make intensive use of the cleaning agent, with a relatively large droplet or jet size as compared with the size of the particles being removed. Thus, in addition to the high cost of the high volume of cleaning agent, expensive high pressure pumps may be required and the cleaning agent may need to be filtered to avoid damage to the substrate. Accordingly, it is desirable to provide a substrate cleaning system and method which is efficient in its use of consumable products such as cleaning agent and does not present high equipment costs.

SUMMARY

In one aspect, the invention is directed to a method for cleaning a substrate. A substrate is provided having first and second generally flat faces. A source of pressurized carrier gas is provided. A source of cleaning agent in liquid form is provided. A flow of the carrier gas is directed along a flow path from the source upstream to the substrate downstream. The cleaning agent is introduced to the flow of carrier gas at least at a first location along the flow path so as to form a vapor of the cleaning agent. The vapor is condensed to form droplets of cleaning agent in the flow at a second location along the flow path, downstream of the first location. The flow of carrier gas containing the droplets is caused to impinge on at least the first face of the wafer so as to clean the first face of debris. Implementations of the inventive method may include one or more of the following. The introduction of the cleaning agent may include bubbling the carrier gas through a body of cleaning agent in liquid form. The body of cleaning agent may be heated to a temperature above an ambient temperature. The vapor may be condensed by externally cooling the flow of carrier gas. The flow of carrier gas containing the droplets may be caused to impinge on both the first and second faces of the substrate and on a substrate perimeter.

In another aspect, the invention is directed to an apparatus for cleaning a substrate. The apparatus includes a source of pressurized carrier gas and a body of cleaning agent in liquid form. A first conduit directs the carrier gas from the source to the body of cleaning agent. A second conduit carries the flow of the carrier gas away from the body of cleaning agent. The flow carried by the second conduit includes cleaning agent in vapor form acquired from the body of cleaning agent. A nozzle is coupled to the second conduit for causing flow of carrier gas containing droplets of the cleaning agent to impinge at least a first face of the substrate.

Implementations of the inventive apparatus may include one or more of the following. The apparatus may include a heater for heating the body of cleaning agent to a temperature above an ambient temperature. The apparatus may include a cooling unit cooling the flow of carrier gas containing cleaning agent vapor. The first conduit may extend into the body of cleaning agent. The first conduit may terminate in a sparger, the sparger emitting bubbles of the carrier gas into the cleaning agent. The body of cleaning agent may be contained within a vessel and the second conduit may extend from a headspace within the vessel, the headspace containing carrier gas and cleaning agent in vapor form. The carrier gas may be compressed air or compressed nitrogen. The carrier gas may be introduced to the body of cleaning agent at a pressure of approximately 80 psi. The cleaning agent may comprise a solution of approximately 5% $NH_4OH$ in deionized water. Impingement of the droplets on the first face of the substrate may act so as to remove residue from the chemical mechanical polishing operation from the first face of the substrate.

According to a further aspect, the invention provides an apparatus for cleaning byproducts of chemical mechanical polishing from a face of a substrate. The apparatus includes an inlet, a mixing unit and a nozzle. The inlet receives the flow of carrier gas. The mixing unit introduces a cleaning liquid into the flow of carrier gas at a location wherein the pressure of the carrier gas is less than 100 psi above an ambient pressure. The nozzle directs the flow of carrier gas to impinge the face of the substrate with droplets of the cleaning liquid.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1 is a schematic view of a wafer cleaning system according to the present invention.

FIG. 2 is a partial schematic cross-sectional view of a nozzle of a wafer cleaning system according to the present invention.

FIG. 3 is a partial schematic cross-sectional view of a condensing section of a wafer cleaning system according to the present invention.

Like reference numbers and designations in the various drawings indicate like elements.

DETAILED DESCRIPTION

FIG. 1 shows a wafer cleaning system 110. The system provides for the mixing of a liquid cleaning agent 12A with a carrier gas 14 for purposes of cleaning a wafer 16. In an exemplary embodiment the liquid cleaning agent 12A consists of an approximate 5% solution of ammonium hydroxide ($NH_4OH$) in deionized water, drawn from a source which may take the form of first storage tank 18. The carrier gas 14 may be drawn from a source which may take the form of second storage tank 20. In an exemplary embodiment, the carrier gas is compressed nitrogen. An alternate source of carrier gas is ambient air which may be compressed to a desired pressure by means of a compressor 22.

The cleaning agent 12A may be drawn from the first tank storage 18 through a cleaning agent supply line or conduit 24 to a mixing tank 26. This may be accomplished by gravity feed, by a pump 28 in-line in the cleaning agent supply line 24, or by other means. A gas supply line or conduit 30 leads from the second storage tank 20 via a valve 32 and/or leads from the compressor 22. The gas supply line 30 extends into the mixing tank 26 and terminates at a foraminous sparger 34 located within a body 12B of liquid cleaning agent in the mixing tank 26. The gas supply line 30 thus forms a first portion of a flow path 38 of carrier gas from the source to the nozzles 66 (FIG. 2). The sparger 34 permits a diffusion of the flow of carrier gas into the body 12B of cleaning agent. The carrier gas is introduced to the body 12B of cleaning agent at an approximate pressure of 80 psi above the ambient atmospheric pressure. The carrier gas forms bubbles 40 which become saturated with vapors of the cleaning agent. The bubbles 40 rise and burst through the surface 42 of the body 12B of cleaning agent and thus fill a headspace 44 of the mixing tank 26 with carrier gas saturated with cleaning agent.

Optionally, a heater 46 may be provided with a heating element 48 for heating the body 12B of cleaning agent to a temperature above an ambient temperature. Typical ambient temperatures may run from about 19° C. to about 24° C. in most factory operations. This allows for an increased concentration of cleaning agent vapor in the carrier gas bubbles 40 diffused through the body 12B of cleaning agent. An exemplary heater 46 may use an electric resistive heating element 48 within the tank 26 or the heat may be applied externally to the tank. Optionally, a fan 49 may be provided to induce current within the body 12B of cleaning agent to help keep the cleaning agent mixed and at a more even temperature throughout the mixing tank 26.

The flow path continues with a flow 50 of carrier gas containing cleaning agent vapor (hereinafter "gas/vapor") exiting the headspace 44 through a conduit or cleaning line 52. The cleaning line 52 may pass through a cooling jacket 54 of a cooling unit 56 which includes a cooling coil 55 (FIG. 3). The cleaning line 52 diverges and terminates at cleaning heads 60A, 60B and 61. The upper cleaning head 60A is provided for cleaning the upper face or surface 74 of the substrate 16 while the lower cleaning head 60B is provided for cleaning the lower face or surface 76 of the substrate. The perimeter cleaning head 61 is oriented perpendicular to the heads 60A and 60B and is directed to clean the perimeter 78 of the substrate 16. The cleaning line 52 may include flexible or extensible lengths 62 to facilitate motion of the cleaning heads 60A and 60B. The sweeping motion of the cleaning heads facilitates the use of a lower flow rate than would be required with fixed heads covering a broader area. The low flow rate enables use of a less expensive, lower capacity system.

As is shown in FIG. 2, the underside (the side facing the respective wafer surface 74 and 76) 64 of each upper and lower cleaning head 60A and 60B bears an array of nozzles 66. Similarly, the inboard side 63 of the cleaning head 61 faces the substrate perimeter 78 and bears a single nozzle 66. In one embodiment, the flow of gas/vapor passes from the cleaning line 52 (FIG. 1) into the interiors 68 of the cleaning heads 60A and 60B and the interior 69 of the cleaning head 61 and through the nozzles 66 to form jets 70. As each jet 70 expands upon exiting the associated nozzle 66, the expansion causes condensation of the cleaning agent into droplets 72 within the jet. The droplets from nozzles 60A, 60B and 61 are caused to impinge the upper and lower faces or surfaces 74 and 76 and the perimeter 78, respectively, of substrate 16 so as to assist in the removal of contaminants 75.

As is shown in FIG. 1, in one embodiment, the substrate 16 is rotated approximately about its central axis 100 in a direction 101 while the cleaning heads 60A and 60B reciprocate along a linear path 102 extending substantially from the axis 100 to the perimeter 78 of the substrate. This may be done with the substrate perimeter secured between three rollers 79 which rotate the substrate while leaving its upper and lower surfaces 74 and 76 exposed. Alternatively, in situations where only an upper cleaning head 60A is provided, the lower surface 76 of the substrate 16 may be engaged to a vacuum turntable (not shown). In an exemplary configuration, used with a 200 mm diameter wafer, the cleaning heads 60A and 60B are generally disc-shaped having a diameter of approximately 25 mm. There are approximately 3–10 nozzles arrayed across each cleaning head 60A and 60B and each nozzle is formed as a right circular bore having a diameter and a length each of approximately 0.1–0.5 mm. The cleaning heads 60A and 60B are reciprocated along the path 102 with the nozzles approximately 5–15 mm from the upper and lower surfaces 74 and 76 of the substrate. As wafer size increases, such as for a 300 mm wafer or greater, it may be desired to increase the number of nozzles or to provide multiple cleaning heads for each surface of the wafer. The heads associated with each surface may be independently movable or may move as a unit. The cleaning head 61 may be located a similar distance from the perimeter of the substrate and the nozzle in the cleaning head 61 may be of a similar geometry to the nozzles of the cleaning heads 60A and 60B.

As is shown in FIG. 3, the optional cooling jacket 54 on supply line 52 may be used to cool the flow 50 in the interior 80 of the cleaning line 52. The cooling causes condensation of droplets 82 of cleaning agent within the cleaning line (i.e., preforming of droplets prior to expansion at the nozzles 66).

The carrier gas containing these droplets may then pass through the cleaning heads 60A, 60B and 61 and their nozzles 66. The precooling of the flow 50 provided by the cooling jacket 54 and the associated preforming of the droplets allows larger droplets to be formed than would be achieved by expansion at the nozzles alone. An exemplary cooling unit 56 may comprise a conventional phase change refrigeration system or may comprise a conventional Peltier-type unit. In certain embodiments, the cooling may be by an amount of approximately 10 to 20° C., for example from a temperature of 50° C. down to a temperature approximately 30° C.

Accordingly, via manipulation of factors including the temperature of the body 12B of cleaning agent (achieved by the heater 46), the cooling of the flow of gas/vapor (achieved by the cooling unit 56), and the selection of nozzle size and geometry (which influences the expansion), the quantity and size of cleaning agent droplets 72 impinged upon the wafer may be controlled. In one embodiment, a preferred typical droplet size is about 40 micrometers at the point of impingement with the surface 74. A preferred range for droplet size is from about 10 to about 100 micrometers or, more particularly, from about 20 to about 50 micrometers. Smaller size droplets may be less effective at cleaning, while larger size droplets may be associated with high consumption of the cleaning agent.

Alternatively, if the vapor pressure of the particular cleaning agent is relatively high, it may be desirable to cool the body 12B of cleaning agent to reduce the amount of cleaning agent introduced to the carrier gas. For example, if the cleaning agent is a particularly high concentration of ammonia in deionized water, cooling may be desired to reduce the vapor pressure. In such a case, element 46 could be formed as a cooling unit with element 48 being formed as a cooling element such as a serpentine tube for phase transition cooling. Alternatively, where the vapor pressure is particularly high, means such as the sparger 34 may not need to be provided to introduce the vapor to the carrier gas.

The invention facilitates the use of a relatively low pressure carrier gas which can be much easier and less expensive to supply than a high pressure carrier gas. Accordingly, in one preferred embodiment, the carrier gas may be provided by a house compressed air system as is common in laboratory and industrial settings. Such systems typically provide compressed air at a pressure of approximately 80 pounds per square inch (psi) above the ambient pressure. A house compressed nitrogen supply, which may be derived from a number of sources, may also be used at similar pressures. In the illustrated embodiment using house compressed air or nitrogen at 80 psi, the vast majority of the pressure drop between the 80 psi source pressure and the ambient pressure occurs upon expansion at the nozzle. Thus, the introduction of the cleaning agent to the carrier gas in the mixing tank 26 occurs at substantially the source pressure. The source pressure is preferably greater than 40 psi and less than 100 psi.

One or more embodiments of the present invention have been described. Nevertheless, it will be understood that various modifications may be made without departing from the spirit and scope of the invention. For example, a variety of other methods exist for generating the required aerosol of cleaning agent droplets in the carrier gas. Certain methods which may be suitable are described by William C. Hinds, Aerosol Technolog, 1982, John Wiley & Sons, Inc., pp. 379–395, the disclosure of which is incorporated herein by reference. A variety of cleaning head and nozzle configurations and movements are also possible.

Accordingly, other embodiments are within the scope of the following claims.

What is claimed is:

1. An apparatus for cleaning a semiconductor substrate, comprising:

a source of pressurized carrier gas;

a supply of liquid cleaning solution containing a cleaning agent;

a first line that directs the pressurized carrier gas through the liquid cleaning solution to generate a vapor that includes the carrier gas and the cleaning agent in vapor form;

a second line that carries the vapor away from the supply of liquid cleaning solution; and a nozzle fluidly coupled to the second line to condense at least a portion of the vapor to produce droplets containing the cleaning agent and to cause the droplets to impinge upon at least a first surface of the substrate to remove contaminants thereon.

2. The apparatus of claim 1 further comprising a heater to heat the cleaning solution to a temperature above an ambient temperature.

3. The apparatus of claim 1 wherein the first line includes a sparger to bubble the carrier gas through the liquid cleaning solution.

4. The apparatus of claim 1 wherein the carrier gas is compressed air.

5. The apparatus of claim 1 wherein the carrier gas is compressed nitrogen.

6. The apparatus of claim 1 wherein the carrier gas is bubbled through the cleaning solution at a pressure of approximately 80 pounds per square inch.

7. The apparatus of claim 1 wherein the cleaning solution includes approximately five percent $NH_4OH$ in deionized water.

8. The apparatus of claim 1 wherein the contaminants include residue from a chemical mechanical polishing operation.

9. The method of claim 1 wherein the carrier gas is air or nitrogen.

10. The apparatus of claim 1 wherein the droplets have a diameter in the range of about 10–100 micrometers.

11. The apparatus of claim 1 wherein the droplets have a diameter in the range of about 20–50 micrometers.

12. The apparatus of claim 1 wherein the droplets have a diameter of about 40 micrometers.

13. The apparatus of claim 1 wherein the nozzle includes one or more right circular bore orifices having a diameter in the range of about 0.1–0.5 mm.

14. An apparatus for cleaning a semiconductor substrate, comprising:

a source of pressurized carrier gas;

a liquid cleaning solution containing a cleaning agent;

a line in which the pressurized carrier gas is directed through the liquid cleaning solution to generate a vapor;

a cooling unit to condense at least a portion of the vapor to produce droplets containing water, the cleaning agent and residual vapor; and a nozzle to cause the droplets to impinge upon at least a first surface of the substrate to remove contaminants thereon.

15. An apparatus for cleaning a semiconductor substrate, comprising:

a source of pressurized carrier gas;

a liquid cleaning solution containing a cleaning agent;

a line in which the pressurized carrier gas is directed through the liquid cleaning solution to generate a vapor;

a first nozzle to condense at least a portion of the vapor to produce droplets containing the cleaning agent, wherein the first nozzle causes the droplets to impinge upon at least a first surface of the substrate to remove contaminants thereon and a second nozzle to condense at least a portion of the vapor to produce droplets containing the cleaning agent, wherein the second nozzle causes the droplets to impinge upon a second surface of the substrate to remove contaminants thereon.

16. The apparatus of claim 15 further including a third nozzle to condense at least a portion of the vapor to produce droplets containing the cleaning agent, wherein the third nozzle causes the droplets to impinge upon a third surface of the substrate to remove contaminants thereon.

17. The apparatus of claim 15 wherein at least one of the first and second nozzles are adapted to reciprocate over the first and second surfaces, respectively, and wherein the substrate is adapted to be rotated.

18. An apparatus for cleaning a semiconductor substrate, comprising:

means for providing a carrier gas;

a liquid solution containing a cleaning agent;

means for directing the carrier gas through the liquid solution to produce a vapor including the cleaning agent;

means for carrying the vapor;

means for condensing the vapor to produce droplets containing the cleaning agent; and first means for causing droplets containing the cleaning agent to impinge upon at least a first surface of the substrate.

19. The apparatus of claim 18 further comprising a means for heating the liquid solution to a temperature above an ambient temperature.

20. The apparatus of claim 18 wherein the means for directing the carrier gas extends into the liquid solution.

21. The apparatus of claim 20 wherein the means for directing the carrier gas terminates in a sparger to emit bubbles of the carrier gas into the liquid solution.

22. The apparatus of claim 18 further comprising a second means for causing droplets containing the cleaning agent to impinge upon at least a second surface of the substrate.

23. The apparatus of claim 18 wherein impingement of the droplets on the first surface of the substrate acts to remove residue from a chemical mechanical polishing operation from the first surface of the substrate.

24. The apparatus of claim 18, wherein the means for condensing includes a cooling unit to condense at least a portion of the vapor.

25. The apparatus of claim 18, wherein the means for condensing includes a nozzle that condenses at least a portion of the vapor.

26. An apparatus for cleaning a semiconductor substrate having a residue resulting from chemical mechanical polishing comprising:

a sparger for bubbling a carrier gas through a cleaning liquid to produce a vapor containing the cleaning agent;

a mixing unit to contain the cleaning liquid wherein the pressure of the carrier gas is less than 100 psi above ambient pressure;

a heater to heat the cleaning liquid in the mixing unit;

a condenser to condense at least a portion of the vapor to produce, droplets including the cleaning agent; and a nozzle directing the droplets to impinge upon the surface of the substrate whereby the droplets remove the residue from the face of the substrate.

* * * * *